(12) United States Patent
Henderson et al.

(10) Patent No.: US 9,041,220 B2
(45) Date of Patent: May 26, 2015

(54) SEMICONDUCTOR DEVICE HAVING STACKED MEMORY ELEMENTS AND METHOD OF STACKING MEMORY ELEMENTS ON A SEMICONDUCTOR DEVICE

(71) Applicant: Qualcomm Incorporated, San Diego, CA (US)

(72) Inventors: Brian M. Henderson, Escondido, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/766,218

(22) Filed: Feb. 13, 2013

(65) Prior Publication Data
US 2014/0225280 A1    Aug. 14, 2014

(51) Int. Cl.
| | |
|---|---|
| H01L 23/498 | (2006.01) |
| H01L 21/50 | (2006.01) |
| H01L 25/065 | (2006.01) |
| H01L 25/18 | (2006.01) |
| H01L 23/48 | (2006.01) |
| H01L 23/525 | (2006.01) |

(52) U.S. Cl.
CPC ....... *H01L 21/50* (2013.01); *H01L 2225/06527* (2013.01); *H01L 25/0657* (2013.01); *H01L 25/18* (2013.01); *H01L 2225/06517* (2013.01); *H01L 2225/06589* (2013.01); *H01L 2225/06513* (2013.01); *H01L 2225/06541* (2013.01); *H01L 2225/06562* (2013.01); *H01L 2225/06572* (2013.01); *H01L 2224/16225* (2013.01); *H01L 2924/0002* (2013.01); *H01L 23/481* (2013.01); *H01L 23/49827* (2013.01); *H01L 23/49833* (2013.01); *H01L 23/525* (2013.01)

(58) Field of Classification Search
USPC .......................... 257/678–733, 777, 787–796, 257/E23.001–E23.194
See application file for complete search history.

(56) References Cited

U.S. PATENT DOCUMENTS

| | | | |
|---|---|---|---|
| 6,870,271 | B2 | 3/2005 | Sutherland et al. |
| 7,675,151 | B1 | 3/2010 | Boone |
| 8,115,286 | B2 | 2/2012 | Zhang et al. |
| 2005/0127490 | A1 | 6/2005 | Black et al. |
| 2006/0113663 | A1 | 6/2006 | Yuan et al. |
| 2007/0069390 | A1* | 3/2007 | Chen et al. .................. 257/777 |
| 2010/0314730 | A1 | 12/2010 | Labeeb |
| 2010/0314740 | A1 | 12/2010 | Choi et al. |

FOREIGN PATENT DOCUMENTS

| | | | |
|---|---|---|---|
| WO | 9919911 A1 | 4/1999 | |

OTHER PUBLICATIONS

International Search Report and Written Opinion—PCT/US2014/016081—ISA/EPO—Jun. 10, 2014.

* cited by examiner

*Primary Examiner* — Mamadou Diallo
(74) *Attorney, Agent, or Firm* — Muncy, Geissler, Olds & Lowe, P.C.

(57) ABSTRACT

A semiconductor device includes a die coupled to a substrate, a first memory device coupled to a surface of the die opposite the substrate and a coupling device coupled between the surface of the die opposite the substrate and a second memory device such that the second memory device at least partially overlaps the first memory device. Also disclosed is method of mounting first and second memory devices on a die in an at least partially overlapping manner.

16 Claims, 4 Drawing Sheets

SEMICONDUCTOR DEVICE HAVING STACKED MEMORY ELEMENTS AND METHOD OF STACKING MEMORY ELEMENTS ON A SEMICONDUCTOR DEVICE

FIELD OF THE DISCLOSURE

The present disclosure is directed to a semiconductor device having memory elements stacked thereon and to a method of stacking memory elements on a semiconductor device, and, more specifically, toward a semiconductor device having at a first memory element at least partially overlapping a second memory element and toward a method of stacking memory elements on a semiconductor device in an at least partially overlapping manner.

BACKGROUND OF THE INVENTION

For certain applications, such as through-silicon stacking (TSS) memory-on-logic, it may be desirable to have two memory elements mounted side-by-side on a semiconductor device, two dynamic random access memory (DRAM) dies on an application specific integrated circuit (ASIC), for example, in order to improve overall capacity. Various other types of memory (random access memory (RAM), static RAM (SRAM), phase-change RAM (PRAM), magnetic RAM (MRAM), etc.) could be used in other applications and mounted in a similar manner.

Wide I/O DRAM dies for stacked applications are often configured as mono-die, for availability and cost. High capacity wide I/O DRAM dies may have edges that are about 8-12 mm long. Placing two of these dies on an ASIC that is also about 8-12 mm on each side presents mechanical difficulties because large portions of the DRAM dies extend, unsupported, over the edges of the ASIC. Further, the electrical interface on the DRAM may not intersect the ASIC.

FIG. 1 illustrates a conventional mounting arrangement and depicts a semiconductor die 102 mounted on a package substrate 104 that includes a redistribution layer 106 on the side of the semiconductor die 102 opposite the package substrate 104. First and second memory elements, in this case a first DRAM 108 and a second DRAM 110, are mounted on and electrically connected to the redistribution layer 106 by microbumps 112. As will be evident from FIG. 1, and from FIG. 2 showing the first DRAM 108 and the second DRAM 110 from above, the combined area of the first and second DRAMs 108, 110 is substantially larger than the surface area of the semiconductor die 102, and thus significant portions of each of the first and second DRAMs 108, 110 extend beyond the periphery of the semiconductor die 102 and are unsupported. This configuration may be prone to mechanical failure and may be difficult to position on a substrate because the overhang of the first and second DRAMs 108, 110 extends beyond the footprint of the semiconductor die 102. In addition, such an arrangement may require relatively long routes on backside layers and may require that interfaces be placed very close to the edge of the semiconductor die 102 to accommodate the first and second DRAMs 108, 110.

Another conventional arrangement for mounting two memory elements on a semiconductor die is illustrated in FIG. 3. FIG. 3 illustrates a semiconductor die 302 mounted on a package substrate 304. An interposer 306 is mounted on the side of the semiconductor die 302 opposite the package substrate 304, and the interposer 306 has an area approximately as large as the combined areas of a first DRAM 308 and a second DRAM 310 mounted thereon. The interposer 306 provides mechanical support as well as electrical connections between the semiconductor die 302 and the first DRAM 308 and the second DRAM 310. However, the interposer 306 must have a fine interconnect pitch, and the size of the interposer 306 and the necessarily small interconnect pitch make the interposer 306 costly.

It would therefore be desirable to obtain the benefits of having two memory elements mounted on a semiconductor die while substantially avoiding the foregoing difficulties.

SUMMARY

A first exemplary embodiment of the invention is directed to a semiconductor device comprising a die coupled to a substrate, a first memory device coupled to a surface of the die opposite the substrate and a coupling device coupled between the surface of the die opposite the substrate and a second memory device. The second memory device at least partially overlaps the first memory device.

Another exemplary embodiment of the invention is a semiconductor device that includes a die mounted on a substrate, the die having a first surface facing the substrate and a second surface opposite the substrate. A first memory device is mounted on the second surface of the die, a coupling device is mounted on the second surface of the die, and a second memory device at least partially overlies the first memory device and at least partially overlies the coupling device. Also, the second memory device is electrically coupled to the die by the coupling device.

A further exemplary embodiment of the invention is a method of forming a semiconductor device that includes coupling a die to a substrate such that a first surface of the die faces the substrate and a second surface of the die faces away from the substrate, coupling a first memory device to the second surface of the die, and coupling a second memory device to the second surface of the die such that at least a first portion of the second memory device overlaps the first memory device.

An additional exemplary embodiment of the invention comprises a semiconductor device that includes a die mounted on a substrate, the die having a first surface facing the substrate and a second surface opposite the substrate, a first memory device mounted on the second surface of the die, a second memory device, and mounting means for mounting the second memory device to the second surface of the die such that the second memory device at least partially overlaps the first memory device and for electrically coupling the second memory device to the die.

Yet another exemplary embodiment of the invention comprises a method of forming a semiconductor device that includes steps for coupling a die to a substrate such that a first surface of the die faces the substrate and a second surface of the die faces away from the substrate, steps for coupling a first memory device to the second surface of the die, and steps for coupling a second memory device to the second surface of the die such that at least a first portion of the second memory device overlaps the first memory device.

Another exemplary embodiment of the invention comprises a non-transitory computer-readable storage medium containing instructions that, when executed by a computer, cause the computer to couple a die to a substrate such that a first surface of the die faces the substrate and a second surface of the die faces away from the substrate, to couple a first memory device to the second surface of the die, and to couple a second memory device to the second surface of the die such that at least a first portion of the second memory device overlaps the first memory device.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 4:
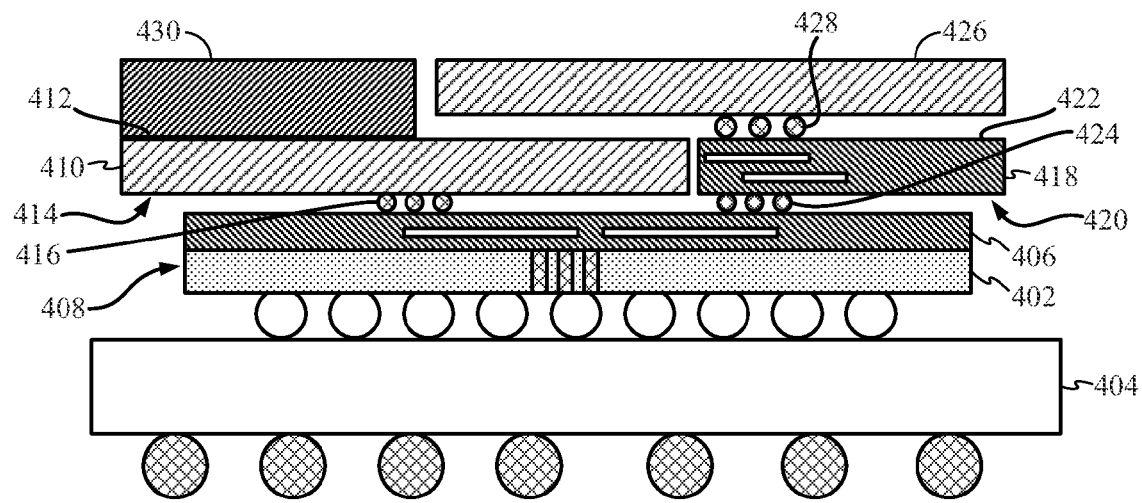
FIG. 4 is a schematic side elevational view of a semiconductor device having two memory elements mounted thereon according to a first embodiment of the disclosure.

FIG. 4 illustrates a semiconductor die 402 mounted on a package substrate 404 and including a redistribution layer 406 on the side of the semiconductor die 402 opposite the package substrate 404. The semiconductor die 402 has a periphery defined by a peripheral edge 408. A first memory device 410, which may comprise a DRAM, has a top surface 412 and is mounted on the semiconductor die 402 so that most or all of the first memory device 410 overlies the semiconductor die 402. Depending on the relative sizes of the first memory device 410 and the semiconductor die 402, the first memory device 410 may be mounted completely within the periphery of the semiconductor die 402 or, as illustrated in FIG. 4, a small portion 414 of the first memory device 410 may extend past the peripheral edge 408 of the semiconductor die 402. The first memory device 410 is coupled to the redistribution layer 406 by microbumps 416 at a first location on the redistribution layer 406 so that the semiconductor die 402 can communicate with the first memory device 410.

An interposer 418 is mounted on the redistribution layer 406 adjacent to the first memory device 410 and may lie completely within the periphery of the semiconductor die 402, or, as illustrated in FIG. 4, a small portion 420 of the interposer 418 may extend beyond the peripheral edge 408 of the semiconductor die 402. The interposer 418 has a top surface 422 and a thickness approximately the same as a thickness of the first memory device 410 so that top surface 412 of the first memory device 410 and the top surface 422 of the interposer 418 are at generally the same distance from the redistribution layer 406 when the first memory device 410 and the interposer 418 are mounted on the redistribution layer 406. Microbumps 424 on the interposer 418 provide an electrical connection between the interposer 418 and a second location on the redistribution layer 406. The interposer 418 also includes through-vias (not illustrated) to connect locations on the top surface 422 of the interposer 418 to the microbumps 424 and provide an electrical pathway through the interposer 418. The interposer 418 could also include a redistribution layer (not illustrated) on either its top or bottom surface, but the use of a redistribution layer on the interposer 418 is generally not required.

Figure 1:
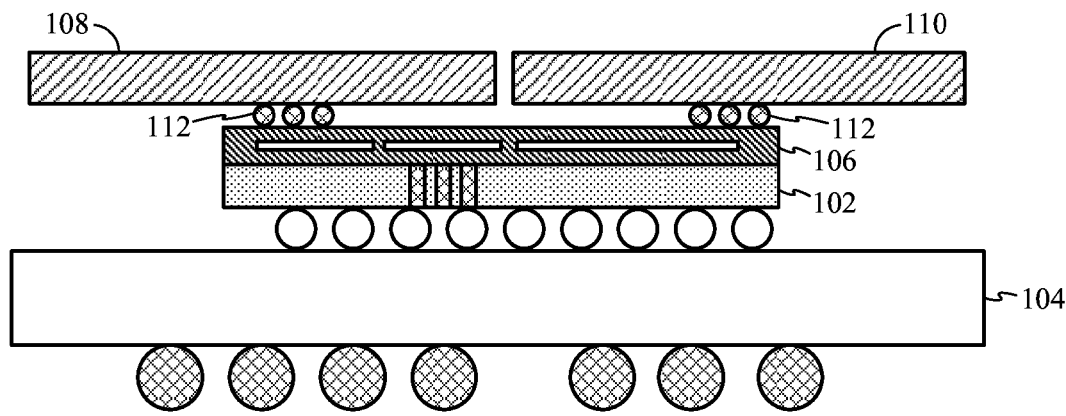
FIG. 1 is a schematic side elevational view of a semiconductor device having two memory elements mounted thereon in a conventional manner.
Figure 2:
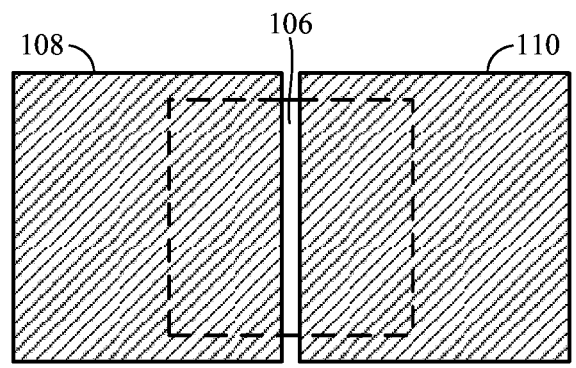
FIG. 2 is a top plan view of the semiconductor device and memory elements of FIG. 1.
Figure 3:
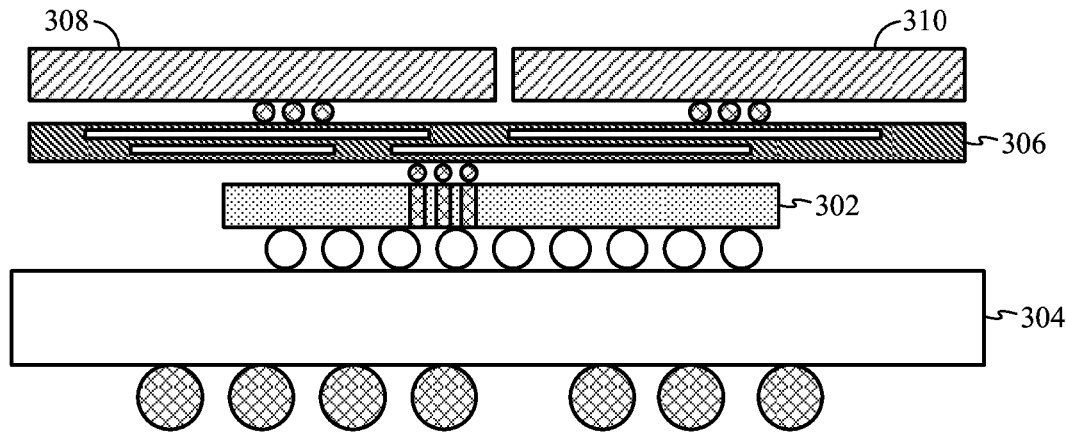
FIG. 3 is a schematic side elevational view of a semiconductor device having two memory elements mounted thereon in another conventional manner.

A second memory device 426 is mounted on and coupled to the interposer 418 so that the second memory device 426 at least partially overlaps the first memory device 410. Microbumps 428 provide an electrical connection between the second memory device 426 and the interposer 418. The second memory device 426 thus overlies the top surface 412 of the first memory device 410 and the top surface 422 of the interposer 418. Mounting the second memory device 426 in this manner increases the combined height of the package formed by the semiconductor die 402 and first memory device 410 and the second memory device 426 as compared to conventional arrangements in which first and second memory devices are mounted in the same plane; however, this stacked arrangement significantly decreases the lateral dimensions of the package and avoids the electrical and mechanical difficulties that may occur when two memory elements 108, 110 are mounted on a semiconductor die 102 in a single plane as illustrated in FIGS. 1-3.

The second memory device 426 may rest on and/or be mechanically connected to the top surface 412 of the first memory device 410, or the second memory device 426 may merely extend over the top surface 412 of the first memory device 410 at a small distance therefrom. Beneficially, this arrangement also reduces the length of electrical connections between the second memory device 426 and the semiconductor die 402 as compared to coplanar mounting arrangements. Optionally, a spacer 430, which may be thermally conductive, may be mounted on a remaining portion of the top surface 412 of the first memory device 410 adjacent to the second memory device 426 that is not covered by the second memory device 426. The spacer 430 may be formed of silicon or other material having comparable thermal and mechanical properties and may enhance mechanical integrity by equalizing mechanical stresses in a molded package including the first and second memory devices 410, 426 and/or enhance heat transfer.

Figure 5:
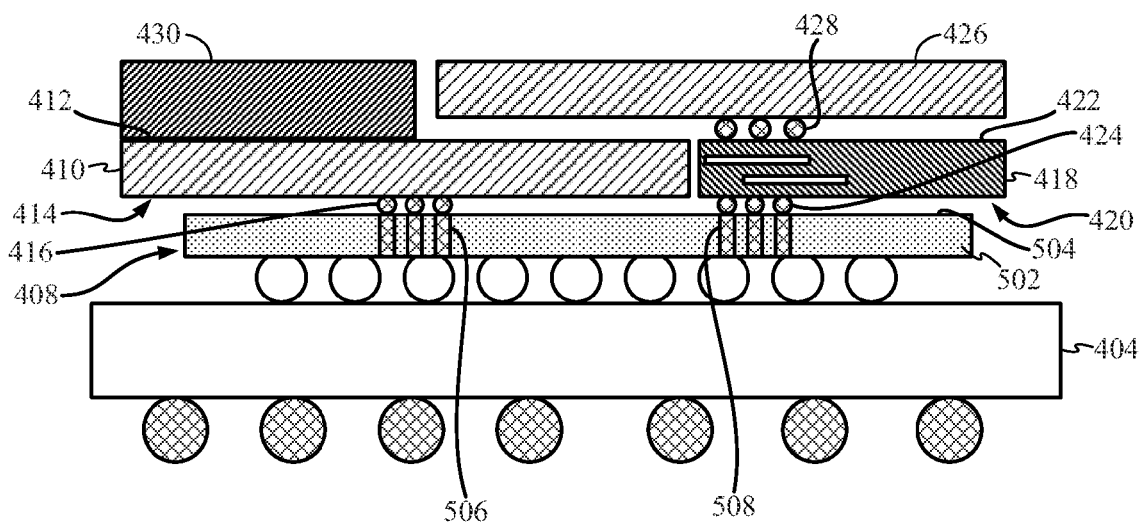
FIG. 5 is a schematic side elevational view of a semiconductor device having two memory elements mounted thereon according to another embodiment of the disclosure.

FIG. 5 illustrates another embodiment that includes a semiconductor die 502 mounted on the package substrate 404 which semiconductor die 502 includes a top surface 504 opposite the package substrate 404. The semiconductor die 502 does not include a redistribution layer but instead has a first location 506 for making an electrical connection with the microbumps 416 of the first memory device 410 and a second location 508 for making an electrical connection with the microbumps 424 of the interposer 418. Other elements of this embodiment are identical to those of the embodiment of FIG. 4.

Figure 6:
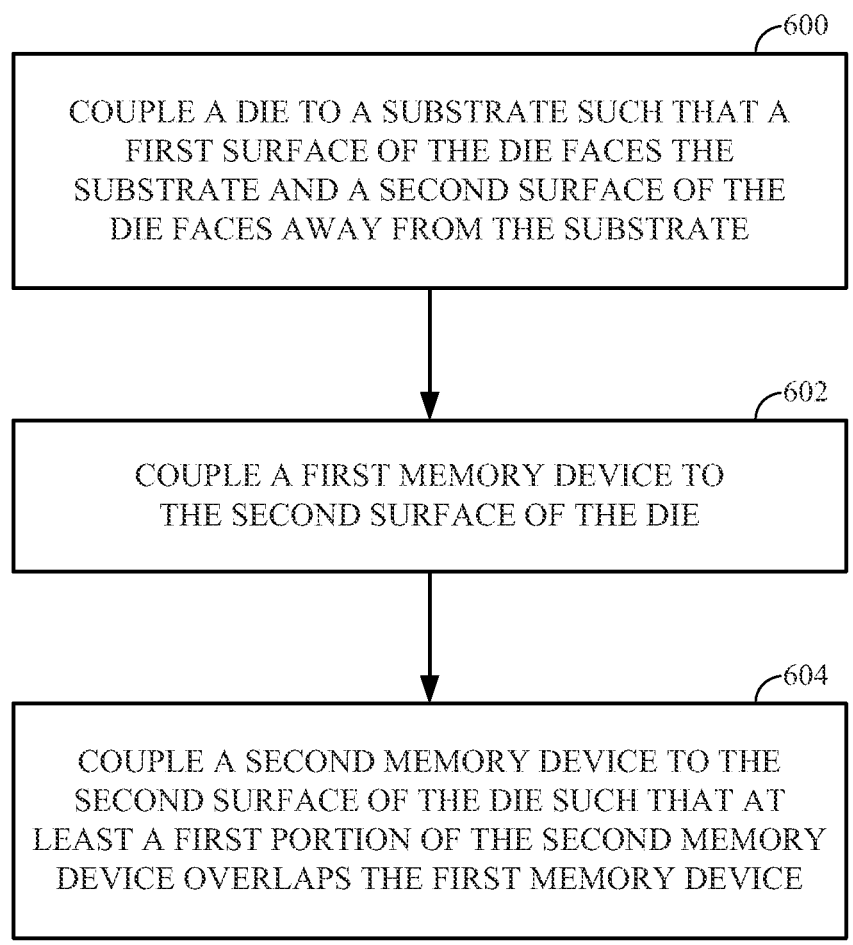
FIG. 6 is a flow chart illustrating a method according to an embodiment of the disclosure.

FIG. 6 illustrates a method according to an embodiment of the disclosure that includes a block 600 of coupling a die to a substrate such that a first surface of the die faces the substrate and a second surface of the die faces away from the substrate, a block 602 of coupling a first memory device to the second surface of the die and a block 604 of coupling a second memory device to the second surface of the die such that at least a first portion of the second memory device overlaps the first memory device.

Figure 7:
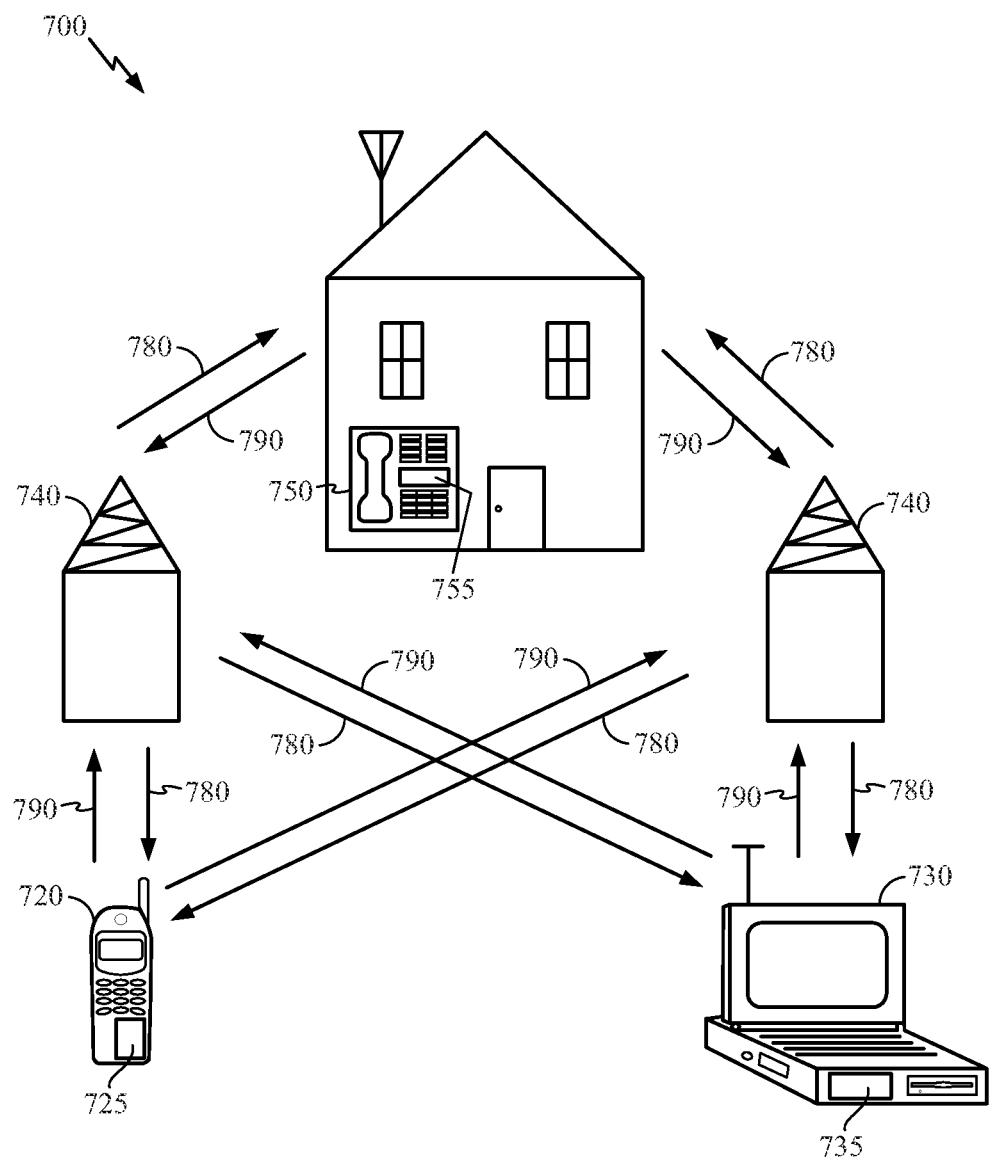
FIG. 7 is a schematic diagram of an exemplary wireless communication system in which embodiments of the disclosure may be used.

FIG. 7 illustrates an exemplary wireless communication system 700 in which one or more embodiments of the disclosure may be advantageously employed. For purposes of illustration, FIG. 7 shows three remote units 720, 730, and 750 and two base stations 740. It will be recognized that conventional wireless communication systems may have many more remote units and base stations. The remote units 720, 730, and 750 include integrated circuit or other semiconductor devices 725, 735 and 755, which are among embodiments of the disclosure as discussed further below. FIG. 7 shows forward link signals 780 from the two base stations 740 and the remote units 720, 730, and 750 and reverse link signals 790 from the remote units 720, 730, and 750 to the two base stations 740.

In FIG. 7, the remote unit 720 is shown as a mobile telephone, the remote unit 730 is shown as a portable computer, and the remote unit 750 is shown as a fixed location remote unit in a wireless local loop system. For example, the remote units may be any one or combination of a mobile phone, hand-held personal communication system (PCS) unit, portable data unit such as a personal data or data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 7 illustrates remote units according to the teachings of the disclosure, the disclosure is not limited to these exemplary illustrated units. Embodiments of the disclosure may be suitably employed in any device having active integrated circuitry including memory and on-chip circuitry for test and characterization.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for forming a semiconductor device. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A semiconductor device comprising:
a die coupled to a substrate;
a first memory device coupled to a surface of the die opposite the substrate;
a coupling device coupled between the surface of the die opposite the substrate and a second memory device, wherein the second memory device at least partially overlaps the first memory device; and
a redistribution layer between the die and the first memory device and the coupling device, wherein the redistribution layer facilitates coupling the first memory device and the coupling device.

2. The semiconductor device of claim 1, wherein at least one of the first or second memory device is a DRAM.

3. The semiconductor device of claim 1, wherein at least one of the first or second memory device is selected from a group consisting of: random access memory (RAM), static RAM (SRAM), phase-change RAM (PRAM), and magnetic RAM (MRAM).

4. The semiconductor device of claim 1, wherein the coupling device is an interposer or spacer.

5. The semiconductor device of claim 1, wherein the die has a single interface electrically coupling the die to the redistribution layer.

6. The semiconductor device of claim 1, further comprising:
a thermally conductive spacer adjacent the second memory device and substantially overlapping a remaining portion of the first memory device.

7. The semiconductor device of claim 1, wherein the coupling device has a height substantially the same height as a height of the first memory device.

8. A device selected from a group consisting of a set top box, a music player, a video player, an entertainment unit, a navigation device, a communications device, a personal digital assistant (PDA), a fixed location data unit, and a computer, including the semiconductor device of claim 1.

9. A semiconductor device comprising:
a die mounted on a substrate, the die having a first surface facing the substrate and a second surface opposite the substrate;
a first memory device mounted on the second surface of the die;
a coupling device mounted on the second surface of the die; and
a second memory device at least partially overlying the first memory device and at least partially overlying the coupling device, the second memory device being electrically coupled to the die by the coupling device.

10. The semiconductor device of claim 9, wherein the coupling device is adjacent to the first memory device on the second surface.

11. The semiconductor device of claim 9, wherein at least one of the first or second memory device is a DRAM.

12. The semiconductor device of claim 9, wherein the coupling device is an interposer or spacer.

13. The semiconductor device of claim 9, further comprising:
a redistribution layer between the die and the first memory device, wherein the redistribution layer facilitates coupling the first memory device and the second memory device to the die.

14. The semiconductor device of claim 9, wherein the coupling device has substantially the same height as the first memory device.

15. A device selected from a group consisting of a set top box, a music player, a video player, an entertainment unit, a navigation device, a communications device, a personal digital assistant (PDA), a fixed location data unit, and a computer, including the semiconductor device of claim 9.

16. A semiconductor device comprising:
a die mounted on a substrate, the die having a first surface facing the substrate and a second surface opposite the substrate;
a first memory device mounted on the second surface of the die;
a second memory device;
mounting means for mounting the second memory device to the second surface of the die such that the second memory device at least partially overlaps the first memory device and for electrically coupling the second memory device to the die; and
a redistribution layer between the die and the first memory device and the mounting means, wherein the redistribution layer facilitates coupling the first memory device and the mounting means.

* * * * *